United States Patent
Yasuda et al.

(10) Patent No.: US 6,764,925 B2
(45) Date of Patent: Jul. 20, 2004

(54) SEMICONDUCTOR DEVICE MANUFACTURING SYSTEM AND ELECTRON BEAM EXPOSURE APPARATUS

(75) Inventors: Hiroshi Yasuda, Tokyo (JP); Shinichi Hamaguchi, Tokyo (JP); Takeshi Haraguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 220 days.

(21) Appl. No.: 09/965,409

(22) Filed: Sep. 26, 2001

(65) Prior Publication Data

US 2002/0039829 A1 Apr. 4, 2002

(30) Foreign Application Priority Data

Oct. 3, 2000 (JP) ........................................ 2000-304245

(51) Int. Cl.⁷ .................. H01L 21/46; H01L 21/78; H01L 21/301
(52) U.S. Cl. .................. 438/463; 438/535
(58) Field of Search .................. 438/57, 463, 473, 438/487, 535

(56) References Cited

U.S. PATENT DOCUMENTS

| | | | |
|---|---|---|---|
| 4,812,661 A | | 3/1989 | Owen |
| 5,929,454 A | * | 7/1999 | Muraki et al. |
| 5,965,308 A | * | 10/1999 | Ozawa |

FOREIGN PATENT DOCUMENTS

| | | |
|---|---|---|
| JP | 5-136038 | 6/1993 |
| JP | 6-291017 | 10/1994 |
| JP | 841681 A2 | 5/1998 |

* cited by examiner

*Primary Examiner*—Phuc T. Dang
(74) *Attorney, Agent, or Firm*—Morrison & Foerster LLP

(57) ABSTRACT

A semiconductor device manufacturing system for manufacturing a semiconductor device on a wafer, comprising: a first exposure apparatus for exposing the wafer using a light source while moving the wafer with a predetermined interval; and a second exposure apparatus for exposing the wafer by irradiating a plurality of electron beams on the wafer, the plurality of electron beams having an interval of substantially N times or 1/N times, where N is a natural number, of the predetermined interval.

18 Claims, 4 Drawing Sheets

SEMICONDUCTOR DEVICE MANUFACTURING SYSTEM AND ELECTRON BEAM EXPOSURE APPARATUS

This patent application claims priority based on a Japanese patent application, 2000-304245 filed on Oct. 3, 2000, the contents of which are incorporated herein by reference.

BACKGROUND OF THE INVENTION

1. Field of the Invention

The present invention relates to a semiconductor device manufacturing system and an electron beam exposure apparatus. More particularly, the present invention relates to a semiconductor device manufacturing system that exposes a wafer using a plurality of electron beams having a preferred interval of separation to manufacture a semiconductor device.

2. Description of the Related Art

A conventional electron beam exposure apparatus that performs an exposure process using a plurality of electron beams irradiates a plurality of electron beams, which are separated from each other with a constant interval, on a wafer and forms an exposure pattern on the wafer. The conventional electron beam exposure apparatus stores all exposure pattern data of the chip to be provided on the wafer and provides to the control system, which controls each of the plurality of electron beams, the individual exposure pattern data based on the stored exposure pattern data. The individual exposure pattern data is an exposure pattern data in the regions where each of the plurality of electron beams should expose. The control system performs exposure process to the wafer based on the individual exposure pattern data by controlling each electron beam.

The conventional electron beam exposure apparatus further has a storing unit that stores an individual exposure pattern data that is extracted from all the exposure pattern data for each of the plurality of electron beams. The storing unit requires a very high-speed semiconductor memory, for example.

The degree of integration of elements such as transistors in an electron device has increased recently. Accordingly, the amount of exposure pattern data, which has to be exposed on the wafer for one electron device, has become large. Thus, a problem occurs such that the conventional electron beam exposure apparatus becomes extremely expensive because the conventional electron beam exposure apparatus requires a storing unit, such as an extremely high-speed semiconductor memory, having a large capacity to store the individual exposure pattern data.

Furthermore, the conventional electron beam exposure apparatus needs to expose one chip by a plurality of electron beams even when the width of the chip to be provided on the wafer is smaller than the interval, i.e. spacing, between the plurality of electron beams. Thus, a problem occurs such that misregistration of the exposure pattern occurs at the boundary between the region where one electron beam exposes one chip and the region where another electron beam, which is adjacent to the just electron beam, exposes the same chip. As a result, the wiring resistance increases or the reliability of the wiring decreases greatly at the place where the misregistration occurs when the exposure pattern is a wiring pattern of the electron device.

SUMMARY OF THE INVENTION

Therefore, it is an object of the present invention to provide a semiconductor device manufacturing system and an electron beam exposure apparatus which overcome the above issues in the related art. This object is achieved by combinations described in the independent claims. The dependent claims define further advantageous and exemplary combinations of the present invention.

According to the first aspect of the present invention, a semiconductor device manufacturing system for manufacturing a semiconductor device on a wafer, comprises: a first exposure apparatus for exposing the wafer using a light source while moving the wafer with a predetermined interval; and a second exposure apparatus for exposing the wafer by irradiating a plurality of electron beams on the wafer, said plurality of electron beams having an interval of substantially N times or 1/N times, where N is a natural number, of the predetermined interval.

The second exposure apparatus may have a plurality of multi-axis electron lenses that converge each beam of the plurality of electron beams independently; and each of the multi-axis electron lenses may have a plurality of lens opening parts for said plurality of electron beams to pass through; and the lens opening parts may be separated with an interval of substantially N times or 1/N times of the predetermined interval of the first exposure apparatus for moving the wafer.

Each of the multi-axis electron lens may have a plurality of dummy opening parts, through which the electron beams do not pass, arranged around a periphery of the plurality of lens opening parts. Each of the multi-axis electron lens may have a lens unit that includes the lens opening parts; and the lens opening parts may be arranged to be uniformly distributed all over the lens unit. Each of the multi-axis electron lens may have a lens unit that includes the lens opening parts; and the lens opening parts may be arranged in the lens unit in a belt-like shape. The lens opening parts at a center region of the lens unit may have a diameter that is smaller than the diameter of the lens opening parts at an outer region of the lens unit.

The lens unit may include a first lens-part magnetic conductive member and a second lens-part magnetic conductive member that are arranged substantially parallel to each other with a space in between; and the lens unit may further include a nonmagnetic conductive member in the space between the first lens-part magnetic conductive member and the second lens-part magnetic conductive member.

Each of the multi-axis electron lens may have a lens unit that includes the lens opening parts and a coil unit provided around the lens unit for generating magnetic fields; and the coil unit may include a coil part magnetic conductive member, which is a magnetic conductive member, and a coil for generating the magnetic fields; and the lens unit may include a plurality of lens-part magnetic conductive members, which are magnetic conductive members; and magnetic permeability of a material that forms the coil-part magnetic conductive member and magnetic permeability of a material that forms the lens-part magnetic conductive members may be different.

The second exposure apparatus may have a plurality of deflectors that deflect each beam of the plurality of electron beams independently; and the deflectors may be separated with an interval of substantially N times or 1/N times of the predetermined interval.

According to the second aspect of the present invention, an electron beam exposure apparatus for exposing a wafer, in combination with exposure by an optical stepper, using a plurality of electron beams, comprises: an exposure unit for exposing the wafer by irradiating the plurality of electron beams on the wafer, the plurality of electron beams having an interval of substantially N times or 1/N times, where N is a natural number, of a predetermined interval of the optical stepper for moving the wafer.

The exposure unit may have a plurality of multi-axis electron lenses that converges each beam of the plurality of electron beams independently; and each of the multi-axis electron lenses may have a plurality of lens opening parts for passage of the plurality of electron beams; and the lens opening parts may be separated with an interval of substantially N times or 1/N times of said predetermined interval.

Each of the multi-axis electron lens may have a plurality of dummy opening parts, through which the electron beams do not pass, arranged around a periphery of the plurality of lens opening parts. Each of the multi-axis electron lens may have a lens unit that includes a plurality of the lens opening parts; and the lens opening parts may be arranged to be substantially uniform all over the lens unit.

Each of the multi-axis electron lens may have a lens unit that includes the lens opening parts; and the lens opening parts may be provided in the lens unit such that the lens opening parts form belt-like shape. The lens opening parts at a center region of the lens unit may have a diameter that is smaller than the diameter of the lens opening parts at an outer region of the lens unit.

The lens unit may include a first lens-part magnetic conductive member and a second lens-part magnetic conductive member that are arranged substantially parallel to each other with a space in between; and the lens unit may further include a nonmagnetic conductive member in the space between the first lens-part magnetic conductive member and the second lens-part magnetic conductive member.

Each of the multi-axis electron lens may have a lens unit that includes the lens opening parts and a coil unit provided around the lens unit for generating magnetic fields; and the coil unit may include a coil part magnetic conductive member, which is a magnetic conductive member, and a coil for generating the magnetic fields; and the lens unit may include a plurality of lens-part magnetic conductive members, which are magnetic conductive members; and magnetic permeability of a material that forms the coil-part magnetic conductive member and magnetic permeability of a material that forms the lens-part magnetic conductive members may be different.

The exposure unit may have a plurality of deflectors that deflect each beam of the plurality of electron beams independently; and the deflectors are separated with an interval of substantially N times or 1/N times of the predetermined interval.

According to the third aspect of the present invention, a method for manufacturing a semiconductor device on a wafer, comprises steps of: exposing the wafer using a light source while moving the wafer with a predetermined interval; and exposing the wafer by irradiating a plurality of electron beams on the wafer, said plurality of electron beams having an interval of substantially N times or 1/N times, where N is a natural number, of the predetermined interval.

This summary of the invention does not necessarily describe all necessary features of the present invention. The present invention may also be a sub-combination of the above described features. The above and other features and advantages of the present invention will become more apparent from the following description of embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiments are not necessarily essential to the invention.

Figure 1A:
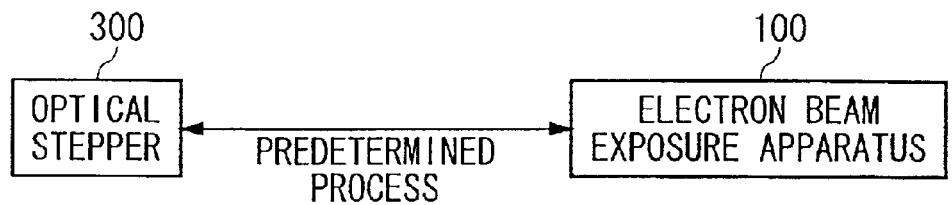
FIGS. 1A through 1C show a semiconductor device manufacturing system 400 according to an embodiment of the present invention.
Figure 1B:
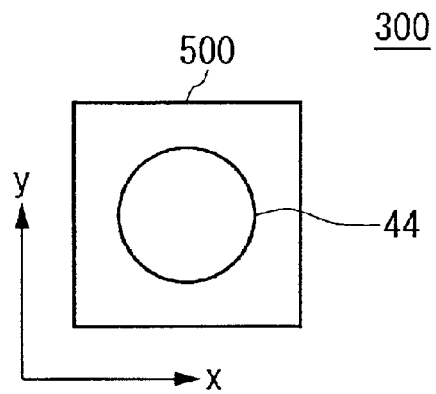

FIG. 1A shows a semiconductor device manufacturing system 400 according to an embodiment of the present invention. The semiconductor device manufacturing system 400 comprises a stepper 300 and an electron beam exposure apparatus 100. The stepper 300 is a first exposure apparatus that performs an exposure process on a wafer 44 using a light source while moving the wafer 44 (as shown in FIG. 1B), on which the semiconductor device is to be provided, for a predetermined interval based upon the pitch of the semiconductor device.

The electron beam exposure apparatus 100 is a second exposure apparatus that performs an exposure process on the wafer by irradiating a plurality of electron beams on the wafer. The electron beams are irradiated on the wafer such that each of the electron beams is separated (i.e., spaced) with an interval of substantially N times or 1/N times, where N is a natural number, of the predetermined interval, which is an interval for moving the wafer in the stepper 300. The predetermined interval may be an interval of substantially M times or 1/M times, where M is a natural number, of the pitch of the electron device to be provided on the wafer.

The stepper 300 comprises a light source, a lens, and a wafer stage 500. The light source irradiates a light having a predetermined wavelength on the wafer 44. The lens adjusts a focus of the light to the wafer 44. The wafer 44 to be exposed is mounted on the wafer stage 500. The wafer stage 500 moves the wafer 44, which is mounted on the wafer stage 500, for a predetermined interval. The light source may be a light source that generates a laser light or an ultraviolet light. The stepper 300 may be a stepper that uses an i-line or g-line or a stepper using an excimer laser.

The electron beam exposure apparatus 100 comprise a means for generating a plurality of electron beams, a multi-axis electron lens, and a deflection unit. The multi-axis electron lens converges the plurality of electron beams independently. The deflection unit deflects the plurality of electron beams independently.

The stepper 300 exposes a desired pattern while moving the wafer 44, on which a photoresist is applied, for a predetermined interval. After the stepper 300 performs the exposure process, the wafer 44 is transported from the stepper 300. Then, a predetermined process such as etching or ion implantation is performed on the wafer 44. After the predetermined process is performed on the wafer 44, an electron beam resist is applied on the wafer 44. Then, the wafer 44 is transported to the electron beam exposure apparatus 100. The electron beam exposure apparatus 100 exposes a desired pattern on the wafer 44 by irradiating a plurality of electron beams, each of which is separated with an interval of substantially N times or 1/N times, where N is a natural number, of the predetermined interval that is the same as the interval of the stepper 300 for moving the wafer 44 as shown in FIG. 1B.

Figure 2:
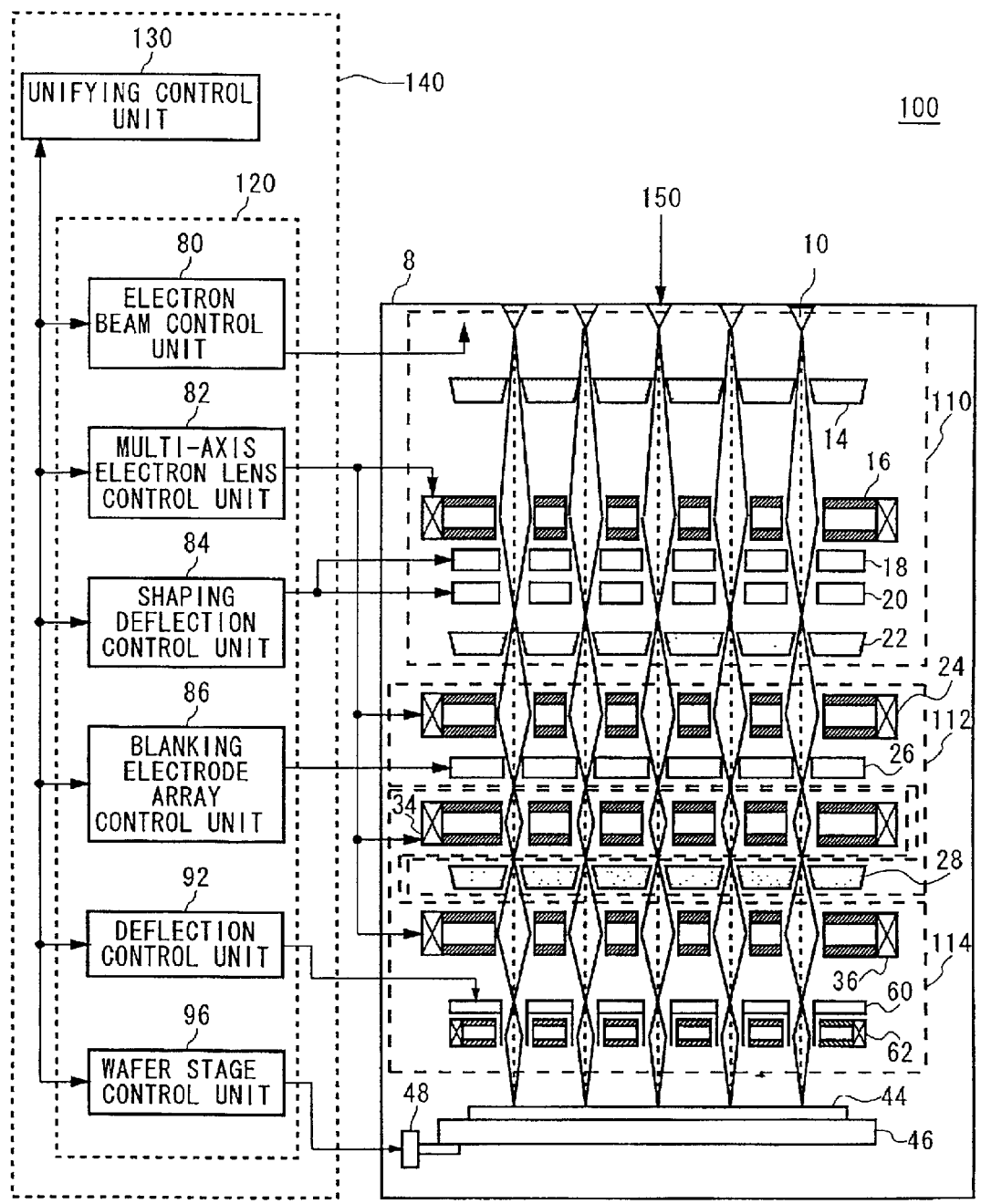
FIG. 2 shows a configuration of an electron beam exposure apparatus according to an embodiment of the present invention.

FIG. 2 shows the configuration of the electron beam exposure apparatus 100 according to an embodiment of the present invention. The electron beam exposure apparatus 100 comprises an exposing unit 150 and a control system 140. The exposing unit 150 performs a predetermined exposure process on a wafer 44 by an electron beam. The control system 140 controls the operation of each component included in the exposing unit 150.

Figure 1C:
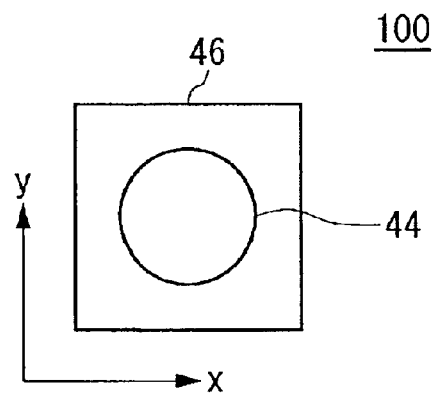

The exposing unit 150 comprises an electron beam shaping unit 110, an irradiation-switching unit 112, and a electron optics inside a casing 8. The electron beam shaping unit 110 generates a plurality of electron beams and shapes the cross sectional shape of an electron beam into the desired shape. The irradiation-switching unit 112 switches whether or not to irradiate an electron beam on the wafer 44 for each of a plurality of electron beams independently. The electron optics includes a wafer projection system 114 that adjusts a direction and a size of an image of the pattern to be transferred to the wafer 44. Furthermore, the exposing unit 150 comprises a wafer stage 46 and stage system that includes a wafer-stage driving unit 48. The wafer 44, on which the pattern is to be exposed, is mounted on the wafer stage 46. The wafer-stage driving unit 48 moves the wafer stage 46 as shown in FIG. 1C.

The electron beam shaping unit 110 has electron guns 10, a first shaping member 14, a second shaping member 22, a first multi-axis electron lens 16, a first shaping deflection unit 18, and a second shaping deflection unit 20. The electron guns 10 generate a plurality of electron beams. The first shaping member 14 and the second shaping member 22 each have a plurality of opening parts that shape the cross sectional shape of an electron beam by passing the electron beam through the opening parts. The first multi-axis electron lens 16 converges each beam of the plurality of electron beams independently to adjust the focus of the electron beams. The first shaping deflection unit 18 and the second shaping deflection unit 20 deflect the plurality of electron beams that pass through the first shaping member 14 independently.

The first multi-axis electron lens 16 includes lens opening parts, through which a plurality of electron beams pass. The lens opening parts converge each of the electron beams independently. Preferably, the lens opening parts are provided in the first multi-axis electron lens 16 such that the interval between each of the lens opening parts is substantially N times or 1/N times of the interval of the stepper 300 for moving the wafer. Furthermore, the interval between each of the electron guns 10, the interval between each of the opening parts included in the first shaping member 14, and the interval between each of the opening parts included in the second shaping member 22 are preferably substantially N times or 1/N times of the interval of the stepper 300 for moving the wafer.

The irradiation-switching unit 112 has a second multi-axis electron lens 24, a blanking electrode array 26, and an electron beam shielding member 28. The second multi-axis electron lens 24 converges a plurality of electron beams independently and adjusts the focus of the electron beams. The blanking electrode array 26 switches whether or not to irradiate the electron beams on the wafer 44 for each of the electron beams independently by deflecting each beam of the plurality of electron beams independently. The electron beam shielding member 28 includes a plurality of opening parts, through which the electron beams pass. The electron beam shielding member 28 shields the electron beams deflected by the blanking electrode array 26.

The second multi-axis electron lens 24 includes lens opening parts, through which a plurality of electron beams pass. The lens opening parts converge each of the electron beams independently. Preferably, the lens opening parts are provided in the second multi-axis electron lens 24 such that the interval between each of the lens opening parts is substantially N times or 1/N times of the interval of the stepper 300 for moving the wafer. Furthermore, the interval between each of a plurality of the opening parts, through which the electron beams pass through, included in the blanking electrode array 26 are preferably substantially N times or 1/N times of the interval of the stepper 300 for moving the wafer. In another example, the blanking electrode array 26 may be a blanking aperture array.

The wafer projection system 114 has a third multi-axis electron lens 34, a fourth multi-axis electron lens 36, a deflection unit 60, and a fifth multi-axis electron lens 62. The third multi-axis electron lens 34 converges a plurality of electron beams independently to reduce the irradiation diameter of the electron beams. The fourth multi-axis electron lens 36 converges a plurality of electron beams independently to adjust the focus of the electron beams. The deflection unit 60 deflects each of a plurality of electron beams independently to the desired position on the wafer 44. The fifth multi-axis electron lens 62 functions as an object lens for the wafer 44 to converge each of a plurality of electron beams independently.

The third multi-axis electron lens 34 and the fourth multi-axis electron lens 36 include lens opening parts, through which a plurality of electron beams pass. The lens opening parts converge each of the electron beams independently. Preferably, the lens opening parts are provided in the third multi-axis electron lens 34 and the fourth multi-axis electron lens 36 such that the interval between each of the lens opening parts is substantially N times or 1/N times of the interval of the stepper 300 for moving the wafer. Furthermore, the interval between each of a plurality of the deflectors, which are included in the deflection unit 60, for deflecting the plurality of electron beams independently is preferably substantially N times or 1/N times of the interval of the stepper 300 for moving the wafer.

The control system 140 comprises a unifying control unit 130 and an individual control system 120. The individual control system 120 has an electron beam control unit 80, a multi-axis electron lens control unit 82, a shaping deflection control unit 84, a blanking electrode array control unit 86, a deflection control unit 92, and a wafer stage control unit 96. The unifying control unit 130 unifies and controls each control unit included in the individual control system 120. A work station is one of example of the unifying control unit 130. The electron beam control unit 80 controls the electron guns 10. The multi-axis electron lens control unit 82 controls the electric current provided to the first multi-axis electron lens 16, the second multi-axis electron lens 24, the third multi-axis electron lens 34, the fourth multi-axis electron lens 36, and the fifth multi-axis electron lens 62.

The shaping deflection control unit 84 controls the first shaping deflection unit 18 and the second shaping deflection unit 20. The blanking electrode array control unit 86 controls the voltage that is applied to the deflection electrode included in the blanking electrode array 26. The deflection control unit 92 controls the voltage applied to the deflection electrode included in a plurality of deflectors that are included in the deflection unit 60. The wafer stage control unit 96 controls the wafer-stage driving unit 48 and moves the wafer stage 46 to the predetermined position.

The operation of the electron beam exposure apparatus 100 according to the present embodiment will be explained in following. First, the electron guns 10 generate a plurality of electron beams. The electron beams generated by the electron guns 10 are irradiated to the first shaping member 14 so that the cross sectional shape of the electron beams are shaped.

The first multi-axis electron lens 16 converges the plurality of electron beams, which are shaped in a rectangular shape, independently. Also, the first multi-axis electron lens 16 adjusts the focus of each of the electron beams independently to the second shaping member 22. The first shaping deflection unit 18 and the second shaping deflection unit 20 deflect the electron beams so as to shape the cross sectional shape of the electron beams based on instruction of the control system 140, which is a control means as explained in connection with FIG. 2.

The first shaping deflection unit 18 deflects each of the plurality of the electron beams, which are shaped in the rectangular shape, independently to the desired position of the second shaping member 22. The second shaping deflection unit 20 deflects each of the plurality of the electron beams, which are deflected by the first shaping deflection unit 18, independently in the substantially perpendicular direction to the second shaping member 22. The second shaping member 22, which includes a plurality of opening parts having a rectangular shape, further shapes the plurality of electron beams, which have a rectangular cross section and are irradiated to each of the opening parts, to the electron beams having a desired rectangular cross sectional shape that are to be irradiated to the wafer 44.

The second multi-axis electron lens 24 converges a plurality of electron beams independently and adjusts the focus of each of the electron beams to the blanking electrode array 26 independently. The electron beams, the focus of which are adjusted by the second multi-axis electron lens 24, pass through a plurality of apertures included in the blanking electrode array 26.

The blanking electrode array control unit 86 controls whether or not to apply voltage on the deflection electrode that is provided nearby each of the apertures formed in the blanking electrode array 26. The blanking electrode array 26 switches whether or not to irradiate the electron beams on the wafer 44 based on the voltage applied on the deflection electrode.

The electron beams, which are not deflected by the blanking electrode array 26, are reduced in their electron beam diameter by the third multi-axis electron lens 34 and passed through the opening parts included in the electron beam shielding member 28. The fourth multi-axis electron lens 36 converges the plurality of electron beams independently and adjusts the focus of each of the electron beams to the deflection unit 60 independently. The electron beams, the foci of which are adjusted, are entered to the deflectors included in the deflection unit 60.

The deflection control unit 92 controls the plurality of deflectors included in the deflection unit 60 independently. The deflection unit 60 deflects each of the plurality of electron beams entered into the plurality of deflectors independently to the desired exposure position of the wafer 44. The foci of the plurality of electron beams that pass through the deflection unit 60 are adjusted to the wafer 44 by the fifth multi-axis electron lens 62, and the electron beams are irradiated to the wafer 44.

During the exposure process, the wafer stage control unit 96 moves the wafer stage 46 in a constant direction. The blanking electrode array control unit 86 sets the apertures that pass through the electron beams based on the exposure pattern data and controls the power for each of the apertures. It is possible to expose the desired circuit pattern on the wafer 44 by properly changing the apertures, through which the electron beams pass, according to the movement of the wafer 44 and further by deflecting the electron beams by the deflection unit 60.

Figure 3A:
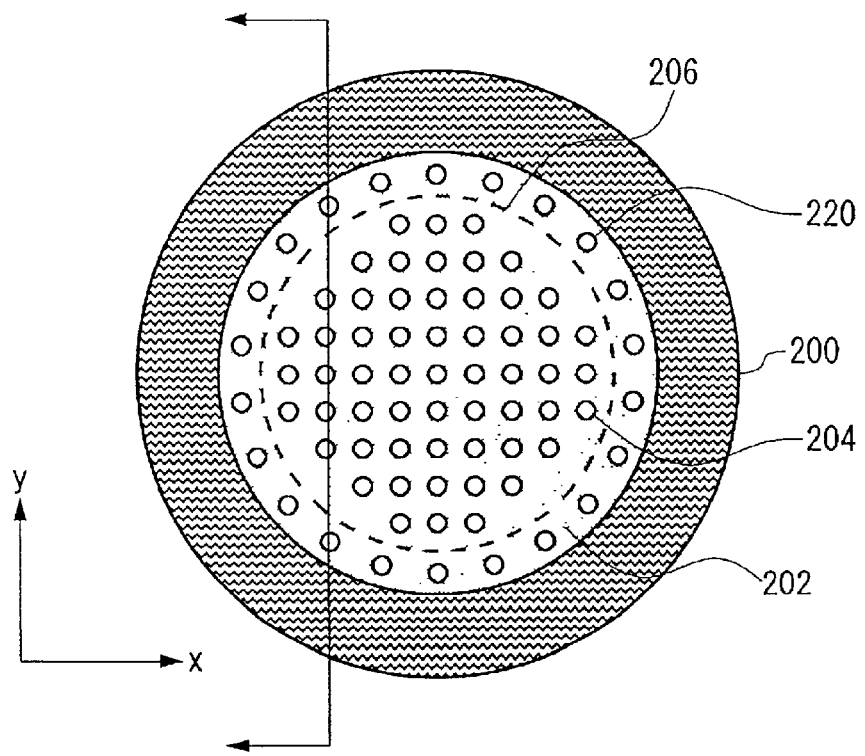
FIGS. 3A and 3B show the top view of the multi-axis electron lenses 16, 24, 34, 36, and 52 which are included in the electron beam exposure apparatus 100 shown in FIG. 2.
Figure 3B:
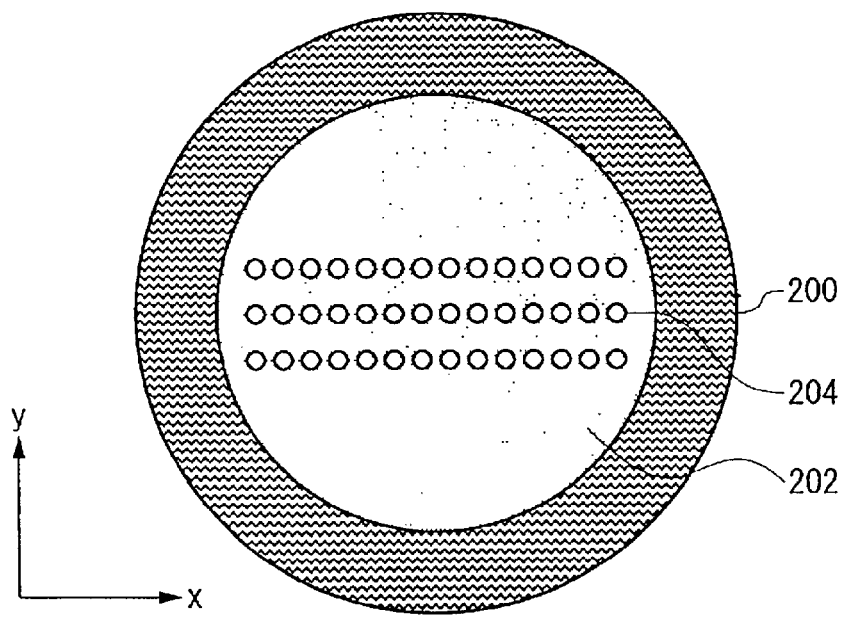

FIGS. 3A and 3B show the top view of the multi-axis electron lenses 16, 24, 34, 36, and 52 included in the electron beam exposure apparatus 100 in FIG. 2. Each of the multi-axis electron lenses 16, 24, 34, 36, and 52 may have a substantially similar structure. In the following, the case of the first multi-axis electron lens 16 will be explained.

The first multi-axis electron lens 16 has a lens unit 202 and a coil unit 200. A plurality of electron beams pass through the lens unit 202. The coil unit 200 is provided around the lens unit 202 and generates magnetic field. The lens unit 202 has a plurality of lens opening parts 204, through which the electron beams pass. The lens opening parts 204 are arranged on the lens unit 202 such that the interval between the center points of each of the lens opening parts 204 has a predetermined interval.

Referring to FIG. 1B, the predetermined interval is desirably an interval that is substantially N times or 1/N times of the interval of the stepper 300 for moving the wafer 44. Moreover, the lens opening parts 204 are preferably arranged in the lens unit 202 so that the positions of the lens opening parts 204 correspond to the positions of the apertures included in the blanking electrode array 26 and the positions of the deflectors included in the deflection unit 60.

Furthermore, the first multi-axis electron lens 16 may have a plurality of dummy opening parts 220, through which the electron beams do not pass, around the periphery of the lens opening parts 204, through which the electron beams do pass, so as to make uniform the magnetic field formed by the plurality of lens opening parts 204. That is, a plurality of dummy opening parts 220 may be formed in the periphery of the lens region 206, shown by the hidden line in FIG. 3A. The plurality of the lens opening parts 204 are formed in the lens region 206. In FIG. 3A, one layer of the dummy opening parts is formed in the lens unit 202. However, a plurality of layers of the dummy opening parts 220 may be formed in the lens unit 202.

Moreover, the diameter of each lens opening part 204 of the plurality of lens opening parts 204 may be different. For example, the diameters of the lens opening parts 204 at the center region of the lens unit 202 may be small, and the diameter of the lens opening parts 204 at the outer region of the lens unit 202 may be large. Furthermore, the diameters of the openings of the respective lens opening parts 204 may be gradually increased from the center of the lens unit 202 to the outer side of the lens unit 202.

The lens unit 202 can make uniform the magnetic fields formed in the plurality of lens opening parts 204 by having the dummy opening parts 220 or by having the lens opening parts 204 which have different diameters.

As shown in FIG. 3A, the lens opening parts 204 are preferably uniformly distributed or arranged all over the lens unit 202 so that the electron beams can be irradiated all over the wafer 44 equally. Furthermore, as shown in FIG. 3B, the lens opening parts 204 may be provided in the lens unit 202 such that the lens opening parts 204 form a belt-like shape. In either case, the lens opening parts 204 are preferably provided on the lens unit 202 such that the interval between the lens opening parts 204 is substantially N times or 1/N times of the interval of the stepper 300 for moving the wafer.

Figure 4A:
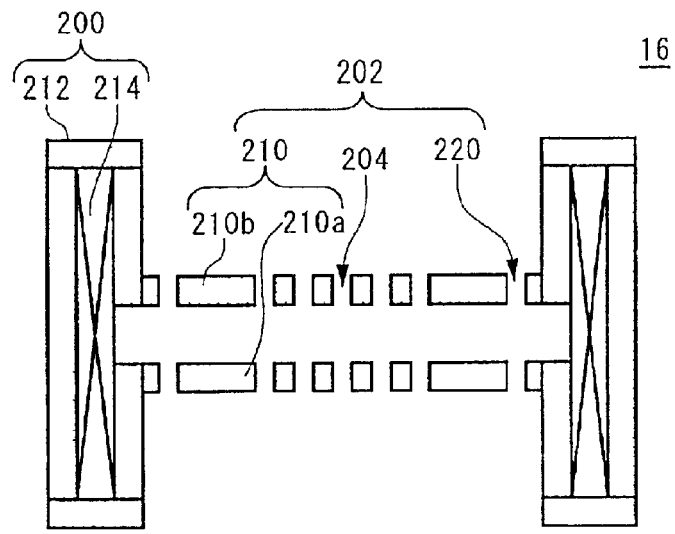
FIGS. 4A through 4C show cross sections of the first multi-axis electron lens 16 shown in FIG. 3A.
Figure 4B:
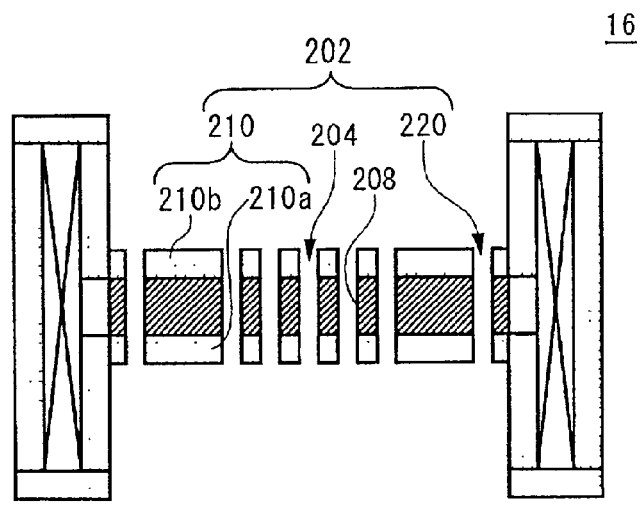
Figure 4C:
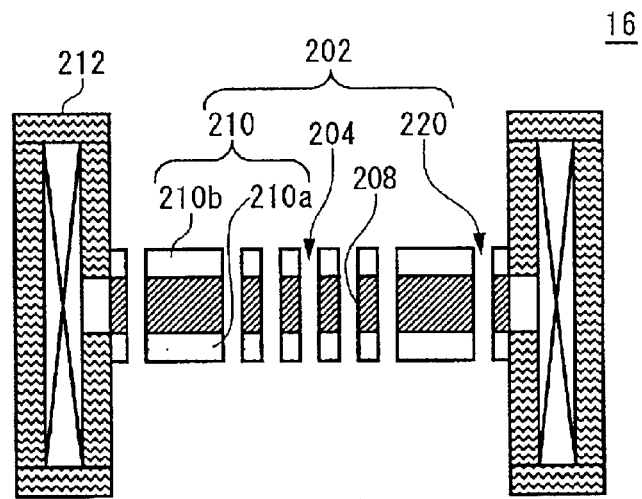

FIGS. 4A–4C show cross sections of the first multi-axis electron lens 16. As shown in FIG. 4A, the coil unit 200 has a coil part magnetic conductive member 212, which is a magnetic conductive member, and a coil 214, which generates magnetic fields. Furthermore, the lens unit 202 has a plurality of lens-part magnetic conductive members 210, which are magnetic conductive members, and a plurality of lens opening parts 204. The lens-part magnetic conductive members 210 include a first lens-part magnetic conductive member 210a and a second lens-part magnetic conductive member 210b.

The first lens-part magnetic conductive member 210a and the second lens-part magnetic conductive member 210b are arranged substantially parallel to each other. A certain space is formed between the first lens-part magnetic conductive member 210a and the second lens-part magnetic conductive member 210b. A first lens-part magnetic conductive member 210a and a second lens-part magnetic conductive member 210b form magnetic fields in the lens opening parts 204. The electron beams entering to the lens opening parts 204 are converged independently by the influence of the magnetic fields generated between the plurality of lens-part magnetic conductive members 210.

As shown in FIG. 4B, the lens unit 202 preferably has a nonmagnetic conductive member 208 between the plurality of lens-part magnetic conductive members 210a and 210b in the region of the lens-part magnetic conductive members 210 except the region where the lens opening parts 204 are provided. The nonmagnetic conductive member 208 may be provided to fill the space between the plurality of lens-part magnetic conductive members 210a and 210b in the region of the lens-part magnetic conductive members 210 except the region where the lens opening parts 204 are provided. Moreover, the nonmagnetic conductive member 208 may be provided to fill a part of the space between the first lens-part magnetic conductive members 210a and the second lens-part magnetic conductive members 210b in the region of the lens unit 202 except the region where the lens opening parts 204 are provided.

The first lens-part magnetic conductive member 210a and the second lens-part magnetic conductive member 210b are preferably arranged substantially parallel to each other while the nonmagnetic conductive member 208 is provided to fill the space formed between the first lens-part magnetic conductive member 210a and the second lens-part magnetic conductive member 210b. Therefore, nonmagnetic conductive member 208 is sandwiched between the first lens-part magnetic conductive member 210a and the second lens-part magnetic conductive member 210b. The nonmagnetic conductive member 208 has a function of shielding the Coulomb force that works between the plurality of neighboring electron beams that pass through the lens opening parts 204. Furthermore, the nonmagnetic conductive member 208 has a function as a spacer for the first lens-part magnetic conductive member 210a and the second lens-part magnetic conductive member 210b when forming the lens unit 202.

As shown in FIG. 4C, each of the coil-part magnetic conductive members 212 and the lens-part magnetic conductive members 210 may be formed by a magnetic conductive member having a different magnetic permeability. Preferably, the magnetic permeability of the material that forms the coil-part magnetic conductive members 212 is higher than the magnetic permeability of the material that forms the lens-part magnetic conductive members 210. For example, the coil-part magnetic conductive member 212 is formed by pure iron, and the lens-part magnetic conductive member 210 is formed by a permeability alloy. By forming the coil-part magnetic conductive members 212 and the lens-part magnetic conductive members 210 with material having a different magnetic permeability, the strength of the magnetic field formed in the plurality of lens opening parts 204 becomes substantially uniform.

The semiconductor device manufacturing system 400 of the present embodiment irradiates the electron beams on the wafer such that the interval between each of the electron beams is substantially N times or 1/N times of the interval of the stepper 300 for moving the wafer. Therefore, the semiconductor device manufacturing system 400 can irradiate the electron beams on the wafer such that the interval between each of the electron beams is separated with a interval substantially M times or 1/M times of the pitch of the chip to be provided on the wafer. Thus, the exposure pattern data, which needs to be stored in the electron beam exposure apparatus 100, can be greatly reduced because the pattern to be irradiated on the wafer by the electron beams and the timing of irradiating the electron beams can be made equal or similar for each electron beam.

Therefore, the capacity of the storing unit for storing the exposure pattern data can be greatly reduced. Thus, an extremely low-price electron beam exposure apparatus can be provided. Furthermore, because one chip, which is to be provided on the wafer, can be exposed by the same electron beam, the misregistration of the exposure position, which occurs when one chip is exposed by a plurality of electron beams, can be greatly reduced or removed. Furthermore, individual exposure pattern data corresponding to the exposure pattern to be exposed to the wafer by the plurality of electron beams can be common.

As clear from the above description, according to the present embodiment, it is possible to provide the electron beam exposure apparatus and the semiconductor device manufacturing system at a price which is low and having a high accuracy of the exposure position.

Although the present invention has been described by way of exemplary embodiments, it should be understood that many changes and substitutions may be made by those skilled in the art without departing from the spirit and the scope of the present invention which is defined only by the appended claims.

What is claimed is:

1. A semiconductor device manufacturing system for manufacturing a semiconductor device on a wafer, comprising:

a first exposure apparatus for forming one part of a pattern of the semiconductor device on the wafer by exposing a light source while moving said wafer with a predetermined interval; and a second exposure apparatus for forming the other part of said pattern of the semiconductor device on the wafer by irradiating a plurality of electron beams on said wafer, said plurality of electron beams having an interval of substantially N times or 1/N times, where N is a natural number, of said predetermined interval.

2. A semiconductor device manufacturing system for manufacturing a semiconductor device on a wafer, comprising:

a first exposure apparatus for exposing said wafer using a light source while moving said wafer with a predetermined interval; and a second exposure apparatus for exposing said wafer by irradiating a plurality of electron beams on said wafer, said plurality of electron beams having an interval of substantially N times or 1/N times, where N is a natural number, of said predetermined interval, wherein said second exposure apparatus has a plurality of multi-axis electron lenses that converge each beam of said plurality of electron beams independently; and each of said multi-axis electron lenses has a plurality of lens opening parts for said plurality of electron beams to pass through; and said lens opening parts are separated with an interval of substantially N times or 1/N times of said predetermined interval of said first exposure apparatus for moving said wafer.

3. A semiconductor device manufacturing system as claimed in claim 2, wherein: each said multi-axis electron lens has a plurality of dummy opening parts, through which the electron beams do not pass, arranged around a periphery of said plurality of lens opening parts.

4. A semiconductor device manufacturing system as claimed in claim 2, wherein:

each said multi-axis electron lens has a lens unit that includes said lens opening parts; and said lens opening parts are arranged to be uniformly distributed all over said lens unit.

5. A semiconductor device manufacturing system as claimed in claim 2, wherein:

each said multi-axis electron lens has a lens unit that includes said lens opening parts; and said lens opening parts are arranged in said lens unit in a belt-like shape.

6. A semiconductor device manufacturing system as claimed in claim 4 or 5, wherein: said lens opening parts at a center region of said lens unit have a diameter that is smaller than the diameter of said lens opening parts at an outer region of said lens unit.

7. A semiconductor device manufacturing system as claimed in claim 4 or 5, wherein:

said lens unit includes a first lens-part magnetic conductive member and a second lens-part magnetic conductive member that are arranged substantially parallel to each other with a space in between; and said lens unit further includes a nonmagnetic conductive member in the space between said first lens-part magnetic conductive member and said second lens-part magnetic conductive member.

8. A semiconductor device manufacturing system as claimed in claim 2, wherein:

each said multi-axis electron lens has a lens unit that includes said lens opening parts and a coil unit provided around said lens unit for generating magnetic fields; and said coil unit includes a coil part magnetic conductive member, which is a magnetic conductive member, and a coil for generating said magnetic fields; and said lens unit includes a plurality of lens-part magnetic conductive members, which are magnetic conductive members; and magnetic permeability of a material that forms said coil-part magnetic conductive member and magnetic permeability of a material that forms said lens-part magnetic conductive members are different.

9. A semiconductor device manufacturing system as claimed in claim 1, wherein:

said second exposure apparatus has a plurality of deflectors that deflect each beam of said plurality of electron beams independently; and said deflectors are separated with an interval of substantially N times or 1/N times of said predetermined interval.

10. An electron beam exposure apparatus for exposing a wafer, in combination with exposure by an optical stepper, using a plurality of electron beams, comprising:

an optical stepper; and an exposure unit for exposing said wafer by irradiating said plurality of electron beams on said wafer in combination with exposure by said optical stepper, said plurality of electron beams having an interval of substantially N times or 1/N times, where N is a natural number, of a predetermined interval of said optical stepper for moving said wafer.

11. An electron beam exposure apparatus as claimed in claim 10, wherein:

said exposure unit has a plurality of multi-axis electron lenses that converges each beam of said plurality of electron beams independently; and each of said multi-axis electron lenses has a plurality of lens opening parts for passage of said plurality of electron beams; and said lens opening parts are separated with an interval of substantially N times or 1/N times of said predetermined interval.

12. An electron beam exposure apparatus as claimed in claim 11, wherein:

each said multi-axis electron lens has a plurality of dummy opening parts, through which the electron beams do not pass, arranged around a periphery of said plurality of lens opening parts.

13. An electron beam exposure apparatus as claimed in claim 11, wherein:

each said multi-axis electron lens has a lens unit that includes a plurality of said lens opening parts; and said lens opening parts are arranged to be substantially uniform all over said lens unit.

14. An electron beam exposure apparatus as claimed in claim 11, wherein:

each said multi-axis electron lens has a lens unit that includes said lens opening parts; and said lens opening parts are provided in said lens unit such that said lens opening parts form a belt-like shape.

15. An electron beam exposure apparatus as claimed in claim 13 or 14, wherein: said lens opening parts at a center region of said lens unit have a diameter that is smaller than the diameter of said lens opening parts at an outer region of said lens unit.

16. An electron beam exposure apparatus as claimed in claim 13 or 14, wherein:

said lens unit includes a first lens-pan magnetic conductive member and a second lens-part magnetic conductive member that are arranged substantially parallel to each other with a space in between; and said lens unit further includes a nonmagnetic conductive member in the space between said first lens-part magnetic conductive member and said second lens-part magnetic conductive member.

17. An electron beam exposure apparatus as claimed in claim 11, wherein:

each said multi-axis electron lens has a lens unit that includes said lens opening parts and a coil unit provided around said lens unit for generating magnetic fields; and said coil unit includes a coil part magnetic conductive member, which is a magnetic conductive member, and a coil for generating said magnetic fields; and said lens unit includes a plurality of lens-part magnetic conductive members, which are magnetic conductive members; and magnetic permeability of a material that forms said coil-part magnetic conductive member and magnetic permeability of a material that forms said lens-part magnetic conductive members are different.

18. An electron beam exposure apparatus as claimed in claim 10, wherein:

said exposure unit has a plurality of deflectors that deflect each beam of said plurality of electron beams independently; and said deflectors are separated with an interval of substantially N times or 1/N times of said predetermined interval.

* * * * *